US012156357B2

(12) United States Patent
Su et al.

(10) Patent No.: US 12,156,357 B2
(45) Date of Patent: Nov. 26, 2024

(54) MODULAR OUTPUT DEVICE

(71) Applicant: Corsair Memory, Inc., Milpitas, CA (US)

(72) Inventors: Shang-Hao Su, Taipei (TW); Yuan-Lien Hsiao, Taipei (TW)

(73) Assignee: Corsair Memory, Inc., Milpitas, CA (US)

( * ) Notice: Subject to any disclaimer, the term of this patent is extended or adjusted under 35 U.S.C. 154(b) by 179 days.

(21) Appl. No.: 17/971,041

(22) Filed: Oct. 21, 2022

(65) Prior Publication Data
US 2023/0199993 A1    Jun. 22, 2023

(30) Foreign Application Priority Data

Dec. 16, 2021  (TW) .................................. 110215021

(51) Int. Cl.
*H05K 7/02*    (2006.01)
(52) U.S. Cl.
CPC .................................. *H05K 7/026* (2013.01)
(58) Field of Classification Search
CPC ....... H05K 7/026; G06F 1/1669; G06F 3/021; G06F 3/03547; G06F 3/0202
See application file for complete search history.

(56) References Cited

U.S. PATENT DOCUMENTS

| | | | | |
|---|---|---|---|---|
| 5,132,876 A * | 7/1992 | Ma | ........................ | G06F 1/1616 361/679.09 |
| 5,400,055 A * | 3/1995 | Ma | ........................ | G06F 1/1632 345/169 |
| 5,677,827 A * | 10/1997 | Yoshioka | ............... | G06F 1/1632 429/97 |
| 6,104,604 A * | 8/2000 | Anderson | ............. | G06F 3/0202 361/679.55 |
| 7,641,348 B2 * | 1/2010 | Yin | ........................ | G06F 1/1632 353/122 |
| 7,848,089 B2 * | 12/2010 | Liang | .................... | G06F 3/0219 361/679.08 |
| 8,238,085 B2 * | 8/2012 | Wu | ........................ | G06F 1/1669 361/679.17 |
| 2013/0222993 A1 * | 8/2013 | Iizuka | .................. | G06F 3/0202 361/679.08 |
| 2019/0196552 A1 * | 6/2019 | Wang | .................... | G06F 1/1616 |
| 2019/0302852 A1 * | 10/2019 | Kitamura | .............. | G06F 3/0202 |
| 2021/0223825 A1 * | 7/2021 | Seiler | .................... | G06F 1/3215 |

* cited by examiner

*Primary Examiner* — Sagar Shrestha
(74) *Attorney, Agent, or Firm* — Carina M. Tan; Corsair Memory, Inc.

(57) ABSTRACT

A modular output device comprises a mainboard, a first assembling component, and a second assembling component. The first assembling component is configured in a first assembly structure of the mainboard, and a first connection module of the first assembling component is electrically connected to a first electrical connector, which allows a master function module and a first function module to transmit data to each other. The second assembling component is configured in a second assembly structure, and a second connection module is electrically connected to a second electrical connector, which allows the master function module and a second function module to transmit data to each other. In this way, the first function module and the second function module can transmit data to an associated computer through the main function module.

10 Claims, 9 Drawing Sheets

MODULAR OUTPUT DEVICE

CROSS REFERENCE TO RELATED APPLICATIONS

This application claims the benefit of priority to Taiwanese patent application no. TW110215021 filed Dec. 16, 2021 entitled "Modular Output Device", the contents of which are incorporated herein by reference in their entirety for all purposes.

TECHNICAL FIELD

The present invention relates to an output device, more particularly relates to an assembled modular output device.

DESCRIPTION OF THE PRIOR ART

Nowadays computer has become an essential too providing a variety of functions. In addition to basic buttons configured on the keyboard, more functional elements will be set on the keyboard to offer more flexible operation of the computer.

Refer to FIG. 1, a keyboard is disclosed. The keyboard comprises a main body 21 and a cushion pad 22 optionally connected with the main body 21. The cushion pad 22 is located below the main body 21 to provide the user's hands a comfortable support while using the keyboard. The main body 21 is provided with a plurality of keys 211, and a functional component 212 located above the plurality of keys 211. The functional component 212 is provided with functional elements like a plurality of indicator lights and a scroll wheel. The plurality of functional elements enable the keyboard to provide more operation modes.

The conventional multifunction keyboard has the following disadvantages:

1. The cushion pad cannot be used to control a computer.

Since the cushion pad is separated from the keyboard, and is only used to provide support for the wrist, there are no functional elements on the cushion pad. Therefore, the user is unable to control the computer with the cushion pad.

2. No assembly structure

The functional elements of the keyboard are commonly fixed on the keyboard body. Since there are no other assembled modules provided on the keyboard body, the functional elements fixed on the keyboard body cannot be separated from the keyboard body.

3. Unable to add new features

As mentioned above, since the functional elements have been fixed on the keyboard body, the functional elements cannot either be removed from the keyboard body, and nor be replaced with other different functional elements.

Therefore, it is desirable to provide an assembled structure on the keyboard with various operation control, and moreover, by which specific functional elements can be used for replacement based upon the user's requirements.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures.

DESCRIPTION OF EMBODIMENTS

Figure 1:
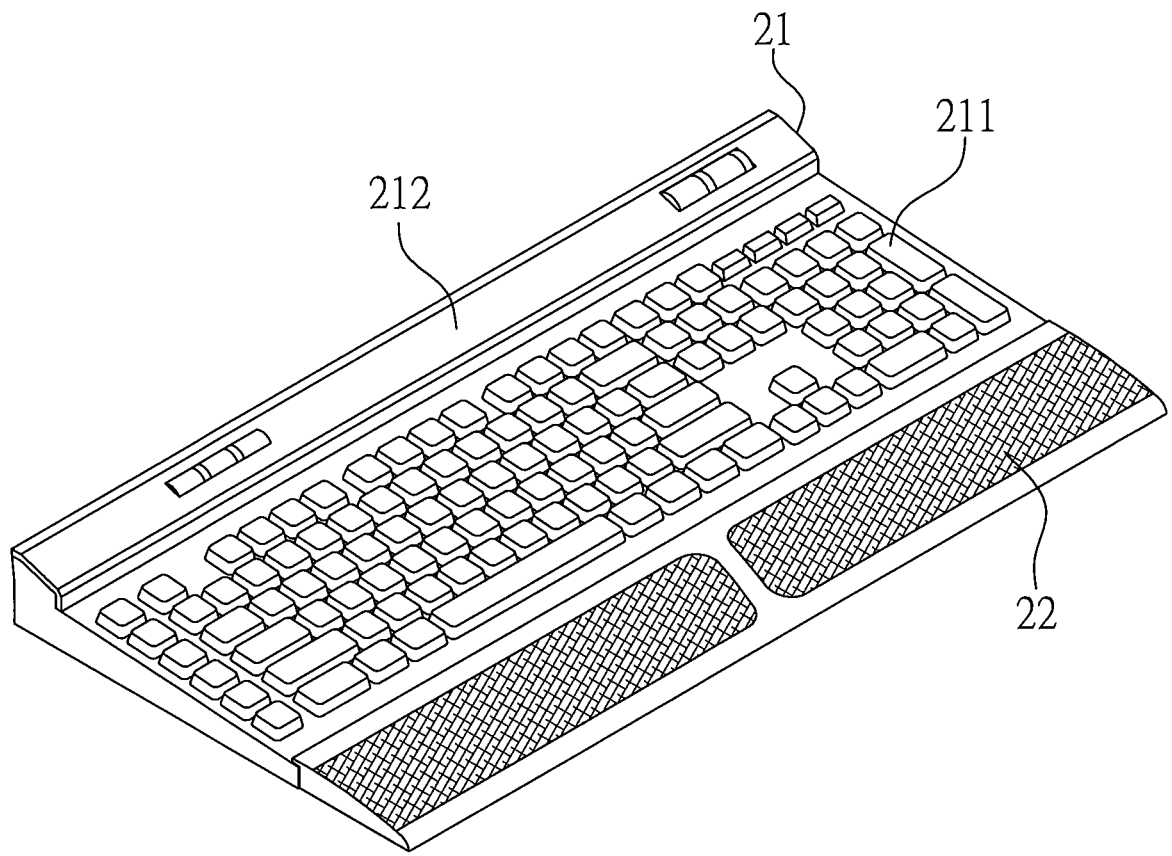
FIG. 1 illustrates a perspective view of a conventional keyboard.
Figure 2:
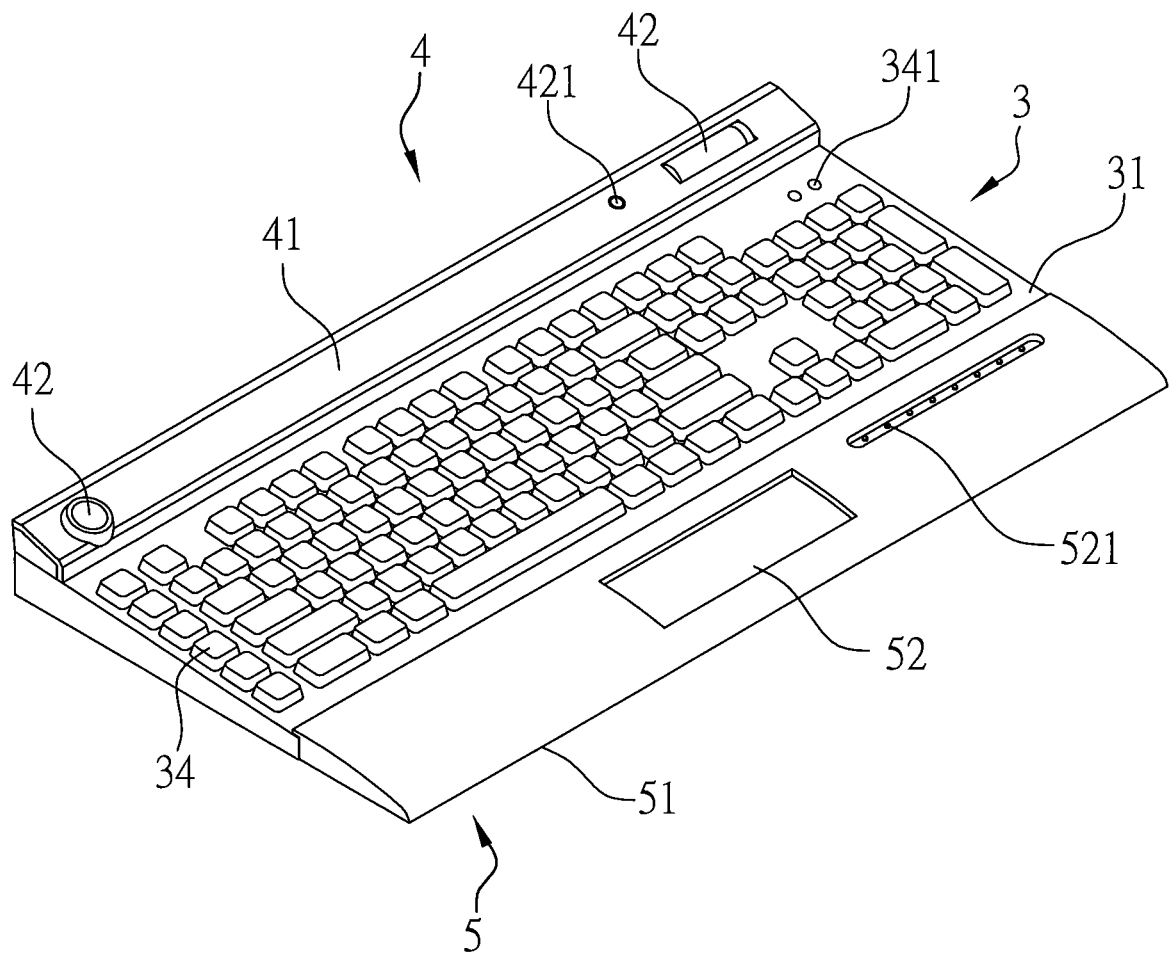
FIG. 2 is a perspective view showing an assembled modular output device in accordance with certain embodiments of the invention.
Figure 3:
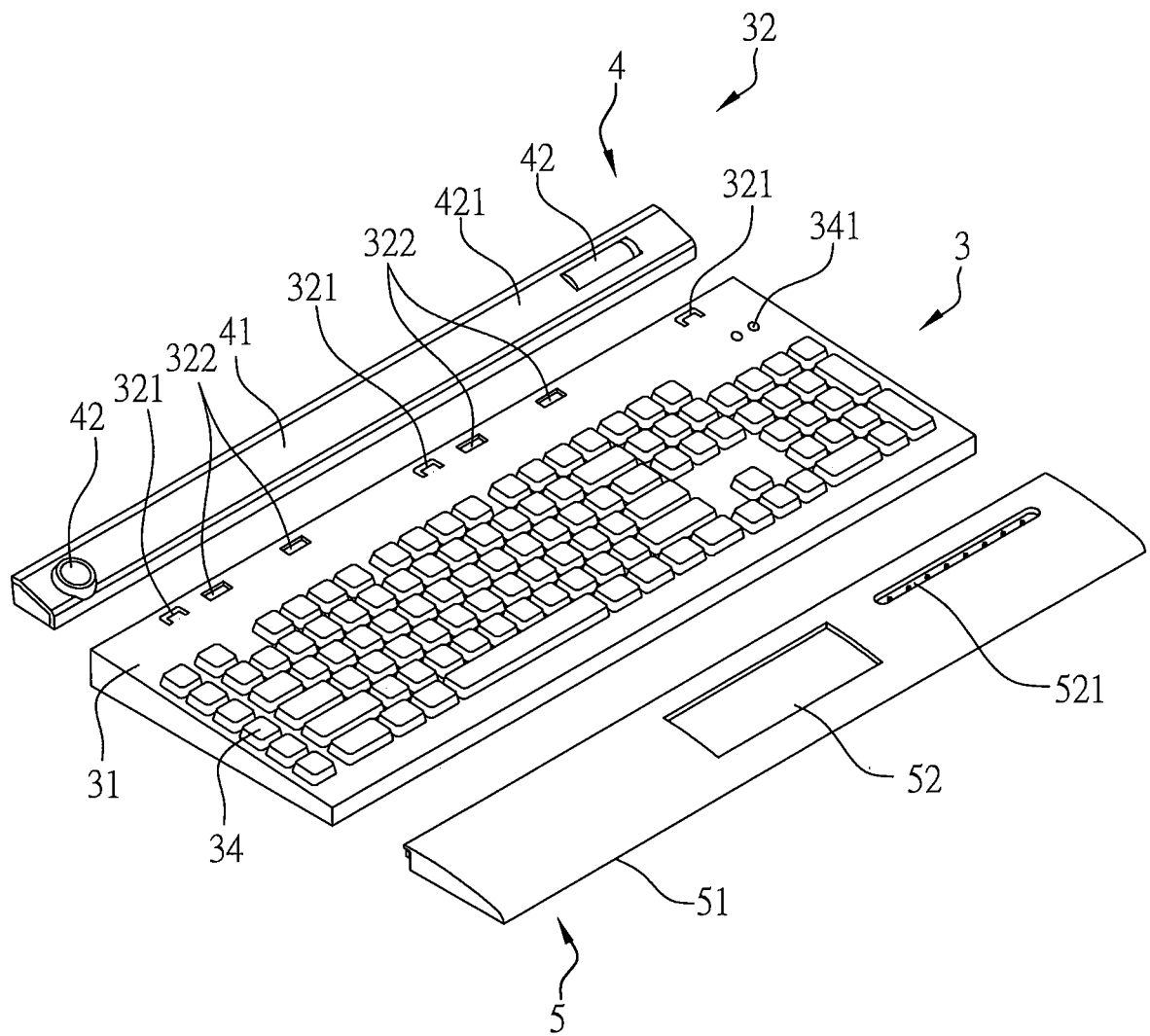
FIG. 3 is a perspective view showing a disassembled modular output device in accordance with certain embodiments of the invention.

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

Referring to FIGS. 2-5, the modular output device comprises a main body 3, a first assembling component 4, and a second assembling component 5, according to certain embodiments.

The main body 3 includes a mainboard 31, a first assembly structure 32 configured on the mainboard 31, a second assembly structure 33 configured on the mainboard 31, a master function module 34 configured on the mainboard 31, a plurality of first electrical connectors 35 installed in the first assembly structure 32 and electrically connected to the master function module 34, and a plurality of second electrical connector 36 installed in the second assembly structure 33 and electrically connected to the master function module 34, according to certain embodiments. In one non-limiting example, the number of the first assembly structure 32 and the second assembly structure 33 may be plural, and they may be separately arranged in other positions of the mainboard 31, which may vary from implementation to implementation.

Preferably, the master function module 34 is an output circuit with multiple key switches to allow the keyboard to output data, according to certain embodiments. In one non-limiting example, the master function module 34 may be one selected from the group consisting of optical switches, mechanical switches, inductive switches, magnetic switches, touch sensors, proximity sensors, display screens, touch screens, wired connectivity, wireless connectivity, RGB lightings, and combinations thereof, or other output circuits, which may vary from implementation to implementation. The optical switches, mechanical switches, inductive switches, magnetic switches, touch sensors, proximity sensors, and touch screens can output data. The display screens, touch screens, and RGB lightings can receive and output data. The wired connectivity and wireless connectivity can be used for data transmission, which allows the computer to transmit data to the master function module 34. The master function module 34 can also be an RGB lighting with a microcontroller, which is used to execute the stored lighting effect program and output the corresponding lighting effect.

According to certain embodiments, the first assembly structure 32 has a plurality of first assembly slots 321 mounted on the mainboard 31, and a plurality of second assembly slots 322 mounted on the mainboard 31. The second assembly structure 33 is a combination wall with a plurality of magnetic attractors, and the plurality of magnetic attractors are arranged at intervals below the master function module 34. The first assembly structure 32 and the second assembly structure 33 are arranged at intervals on the upper and lower sides of the master function module 34. According to certain embodiments, the first assembly structure 32 and the second assembly structure 33 may be presented in other forms, and may vary from implementation to implementation.

The first assembling component 4 includes a first assembling body 41 optionally configured in the first assembly structure 32, a plurality of first function module 42 configured on the first assembling body 41, and a plurality of first connection module 43 configured on the first assembling body 41 and electrically connected to the first function module 42. The position of the first electrical connector 35 located at the first assembly structure 32 corresponds to the position of the first connection module 43 located at the first assembling body 41, so that when the first assembling body 41 is mounted on the first assembly structure 32, the first connection module 43 is electrically connected to the first electrical connector 35, and allows the master function module 34 to have a signal connection with the first function module 42.

According to certain embodiments, the plurality of first function modules 42 are a rotary component arranged on the left side of the first assembling body 41, and a rolling element arranged on the right side of the first assembling body 41. The rotary component can be rotated clockwise or counterclockwise by the user. The rolling element can be pushed upward or downward by the user. The data that the user controls the plurality of first function modules 42 will be transmitted to the master function module 34, so as to further control the computer. In addition, the data output from the computer will also be transmitted to the first function module 42 through the master function module 34. In one non-limiting example, the first function module 42 may be one selected from the group consisting of rollers, dials, touch sensors, proximity sensors, display screens, touch screens, wired connectivity, wireless connectivity, RGB lightings, and combinations thereof, or other functional components, which may vary from implementation to implementation.

According to certain embodiments, the first assembling body 41 is provided with a plurality of first assemblies 411, and the plurality of first assemblies 411 are protrusions configured on the bottom surface of the first assembling body 41. The plurality of first assemblies 411 can be respectively inserted into the plurality of first assembly slots 321 of the first assembly structure 32, and the plurality of first assemblies 411 are buckled with the plurality of first assembly slots 321, so that the first assembling body 41 can be fixed on the mainboard 31. Since there are many types of assembly mechanism, and it is not the primary feature of the present invention, the detail will not be elaborated further hereinafter.

The second assembling component 5 includes a second assembling body 51 optionally configured in the second assembly structure 33, a second function module 52 configured on the second assembling body 51, and a plurality of second connection module 53 configured on the second assembling body 51 and electrically connected to the second function module 52. The position of the second electrical connector 36 located at the second assembly structure 33 corresponds to the position of the second connection module 53 located at the second assembling body 51, so that when the second assembling body 51 is configured in the second assembly structure 33, the second connection module 53 is electrically connected to the second electrical connector 36, and allows the master function module 34 to have a signal connection with the second function module 52.

According to certain embodiments, the second function module 52 is a touch panel for receiving touch data generated by the user. The second function module 52 transmits the touch data to the master function module 34, and the master function module 34 then transmits data to the computer, so as to control the computer. In one non-limiting example, the plurality of second function modules 52 can be provided on the second assembling body 51, and the second function module 52 may be one selected from the group consisting of batteries, RGB lightings, touch sensors, proximity sensors, and combinations thereof, or other functional components, which may vary from implementation to implementation. When the second function module 52 is a battery, which can provide stored power for the master function module 34, the first function module 42, or other second function modules 52. Moreover, since the surface of the second assembling body 51 is made of cushioning material, the user's wrist can be placed on the second assembling body 51. In this way, the second assembling body 51 can allow the user's wrist to rest comfortable on the cushioning material while using the keyboard.

According to certain embodiments, the second assembling body 51 is provided with a plurality of second assemblies 511, and the plurality of second assemblies 511 are magnetic attractors arranged on the top edge of the second assembling body 51. Each of the plurality of second assemblies 511 can be magnetically attracted to the plurality of magnetic attractors of the second assembly structure 33, so that the second assembling body 51 can be assembled under the mainboard 31.

It is worth mentioning that the master function module 34 has an extension status display unit 341 configured on the mainboard 31. The master function module 34 controls the extension status display unit 341 to send out the signal connection status between the master function module 34 and the first function module 42, and the signal connection status between the master function module 34 and the second function module 52. The first function module 42 has a first assembling status display unit 421 configured on the first assembling body 41. The first function module 42 controls the first assembling status display unit 421 to send out the signal connection status between the master function module 34 and the first function module 42. The second function module 52 has a second assembling status display unit 521 configured on the second assembling body 51. The second function module 52 controls the second assembling status display unit 521 to send out the signal connection status between the master function module 34 and the second function module 52.

According to certain embodiments, the extension status display unit 341 is two indicator lights arranged on the mainboard 31 to respectively display the assembling status of the mainboard 31 and the first assembling body 41 and the second assembling body 51. The first assembling status display unit 421 is an indicator light provided on the first assembling body 41 to display the assembling status of the first assembling body 41 and the mainboard 31. The second assembling status display unit 521 is an indicator light provided on the second assembling body 51 to display the assembling status of the second assembling body 51 and the mainboard 31.

When the first assembling body 41 is not mounted on the mainboard 31, the first connection module 43 and the first electrical connector 35 are separated, and the first function module 42 cannot transmit data to the master function module 34. At this time, the extension status display unit 341 and the first assembling status display unit 421 will not emit light. When the first assembling body 41 is mounted on the mainboard 31, the first connection module 43 is electrically connected to the first electrical connector 35. At this time, the first function module 42 and the master function module 34 can transmit data to each other, and one of the extension status display units 341 and the first assembling status display unit 421 will emit light, thereby outputting the electrical connection status of the first connection module 43 and the first electrical connector 35.

When the second assembling body 51 is not mounted on the mainboard 31, the second connection module 53 and the second electrical connector 36 are separated, and the second function module 52 cannot transmit data to the master function module 34. At this time, the extension status display unit 341 and the second assembling status display unit 521 will not emit light. When the second assembling body 51 is mounted on the mainboard 31, the second connection module 53 is electrically connected to the second electrical connector 36. At this time, the second function module 52 and the master function module 34 can transmit data to each other, and another one of the extension status display units 341 and the second assembling status display unit 521 will emit light, thereby outputting the electrical connection status of the second connection module 53 and the second electrical connector 36.

It is worth mentioning that, according to certain embodiments, the extension status display unit 341, the first assembling status display unit 421, and the second assembling status display unit 521 use light-emitting elements to display whether the first electrical connector 35 and the first connection module 43, and the second electrical connector 36 and the second connection module 53 are in an electrical connection status. In a non-limiting embodiment, the extension status display unit 341, the first assembling status display unit 421 and the second assembling status display unit 521 may be a data output circuit to transmit assembling status data to a computer or microcontroller, so that the computer or microcontroller can tell whether the first electrical connector 35 and the first connection module 43, and the second electrical connector 36 and the second connection module 53 are in an electrical connection status for helping perform subsequent executions of other programs, which may vary from implementation to implementation.

Referring to FIGS. 3, and 6-8, the mainboard 31 has a circuit board, and the first electrical connector 35 is mounted on the mainboard 31, according to certain embodiments. Each of the first electrical connector 35 is provided with a plurality of first contact electrodes 351. The first assembling body 41 has a circuit board, and the first connection module 43 is mounted on the first assembling body 41. Each of the first connection module 43 is provided with a plurality of first pins 431. When the first assembling body 41 and the first assembly structure 32 are assembled, the plurality of first pins 431 push against the plurality of first contact electrodes 351, so that the first function module 42 can transmit data to the master function module 34, according to certain embodiments. The first electrical connector 35 is configured on the inner side wall of the second assembly slot 322 of the first assembly structure 32, and the first connection module 43 needs to extend into the second assembly slot 322, so that an electrical connection with the first electrical connector 35 can be formed, according to certain embodiments.

Figure 4:
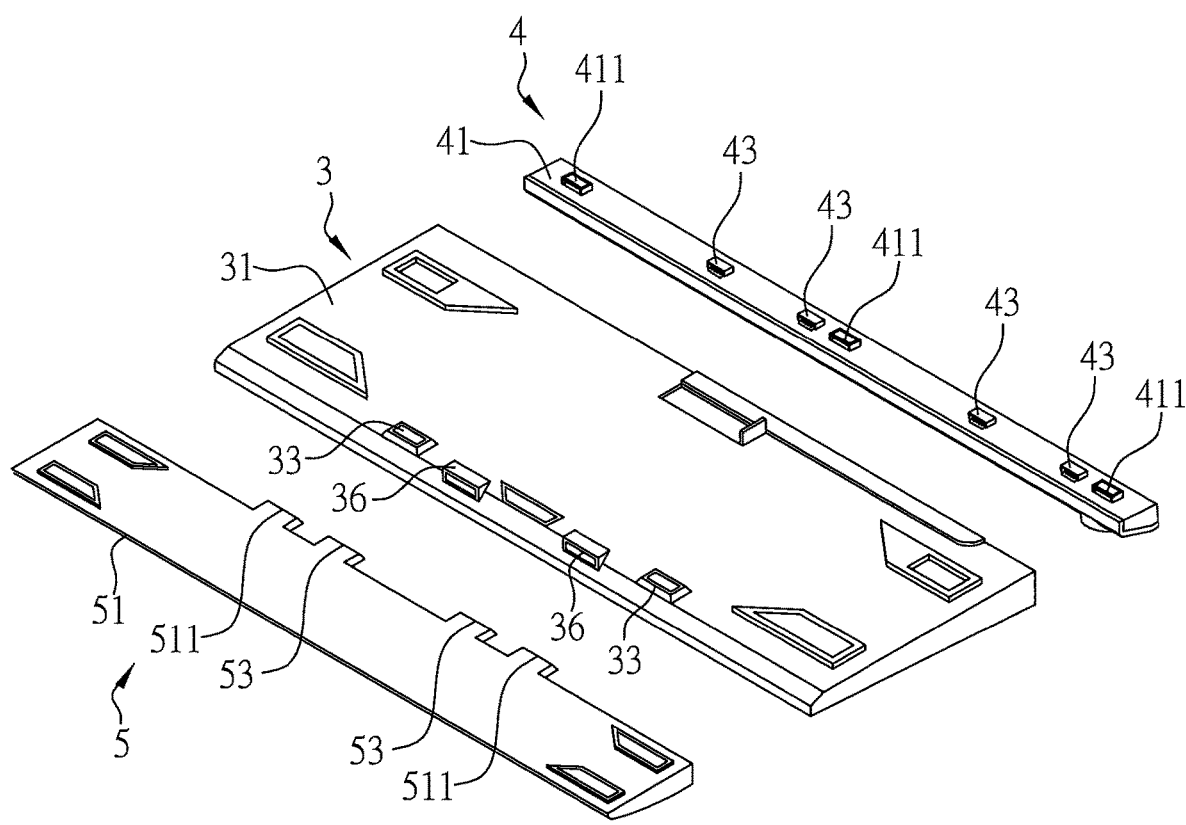
FIG. 4 is a perspective view showing another disassembled modular output device in accordance with certain embodiments of the invention.
Figure 5:
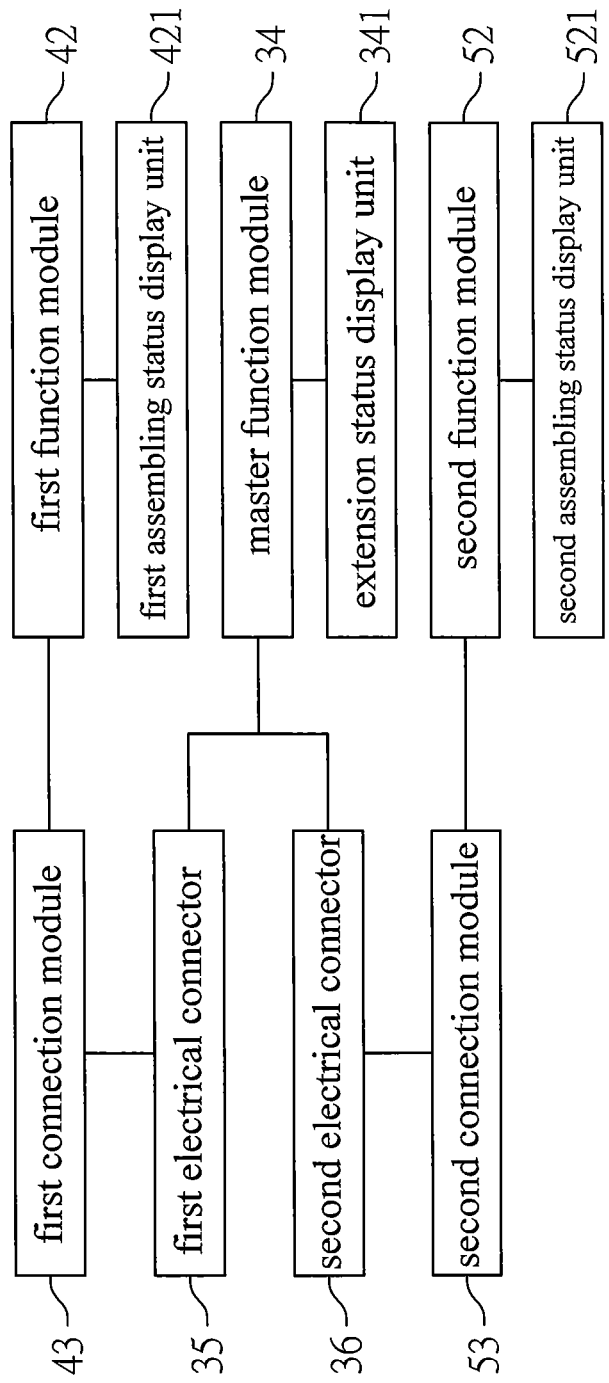
FIG. 5 is a block diagram showing the configuration of electrical connections to internal components in accordance with certain embodiments of the invention.
Figure 6:
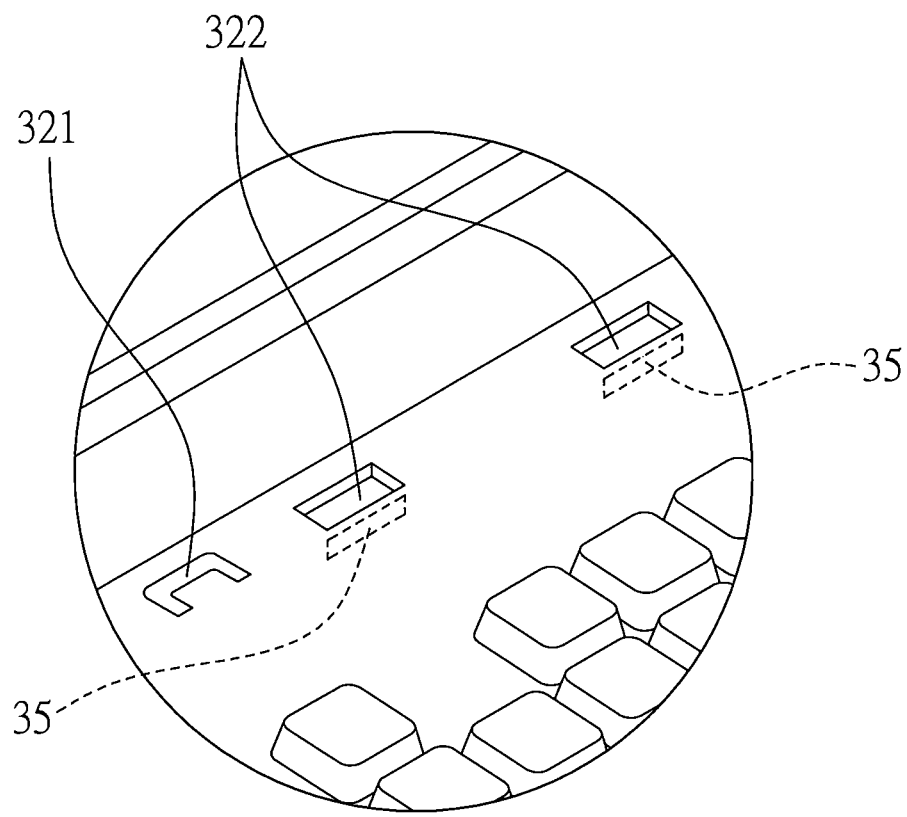
FIG. 6 illustrates an enlarged view showing the configuration of a first electrical connector and a second assembly slot from FIG. 3.
Figure 7:
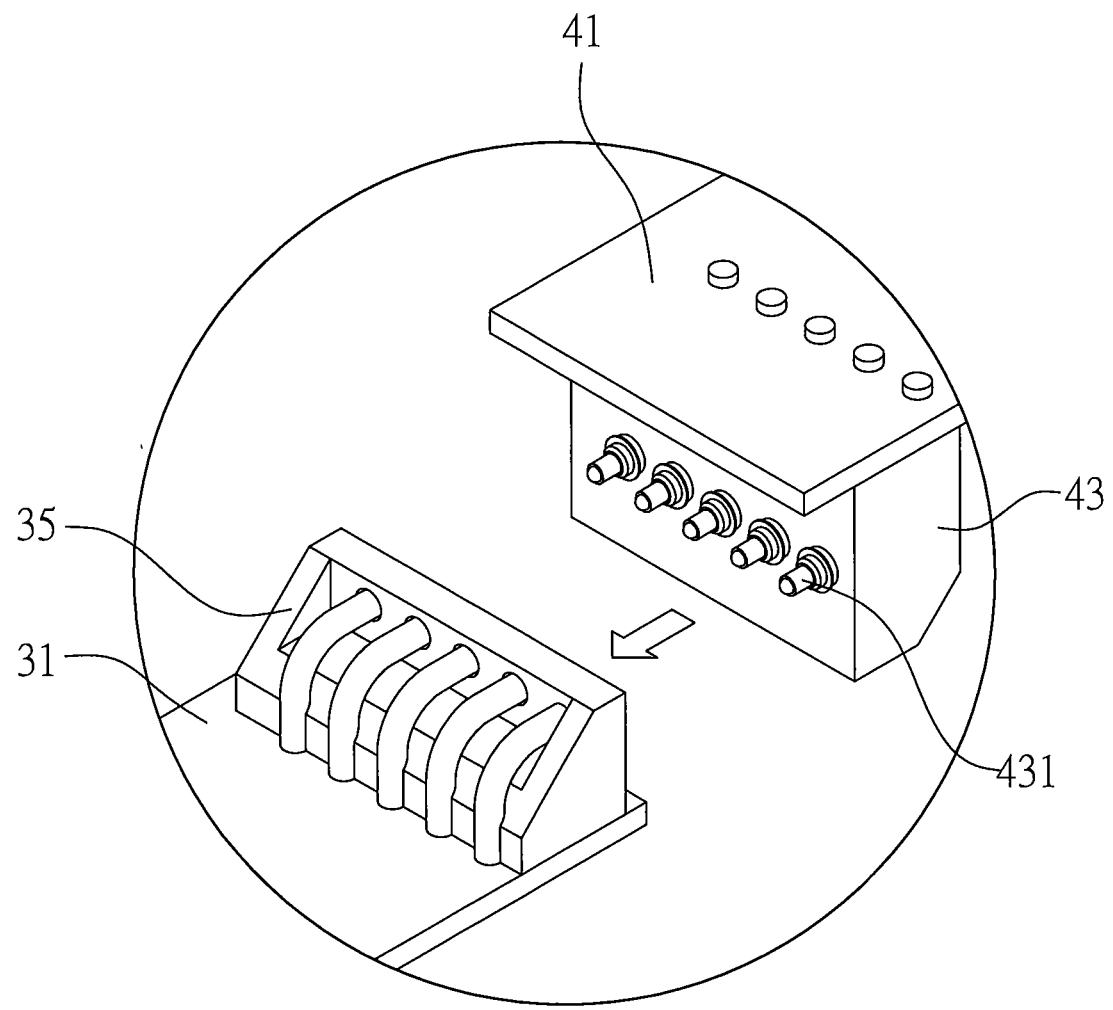
FIG. 7 illustrates an enlarged view showing the first electrical connector and a first connection module in accordance with certain embodiments of the invention.
Figure 8:
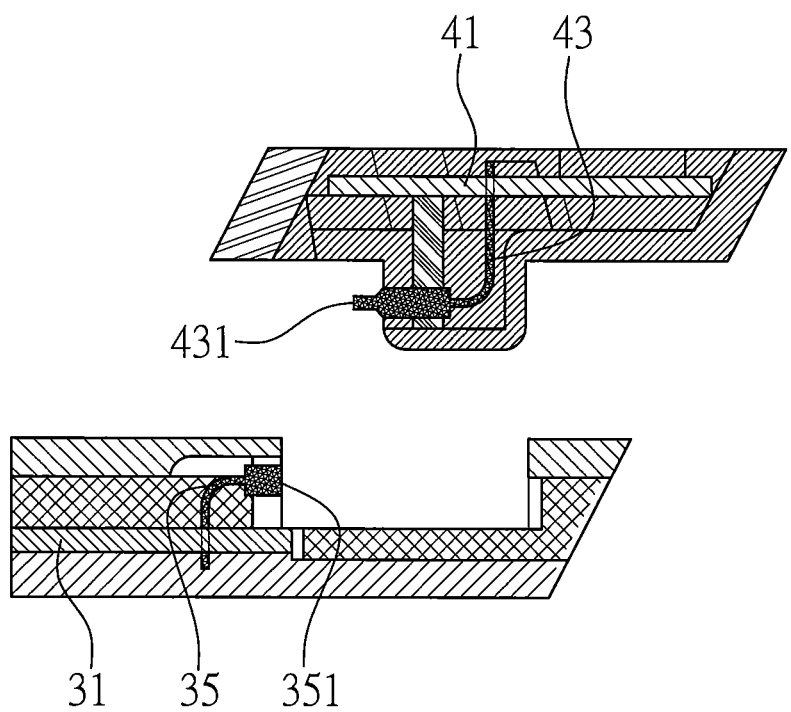
FIG. 8 illustrates a detailed cross-sectional view from FIG. 3.
Figure 9:
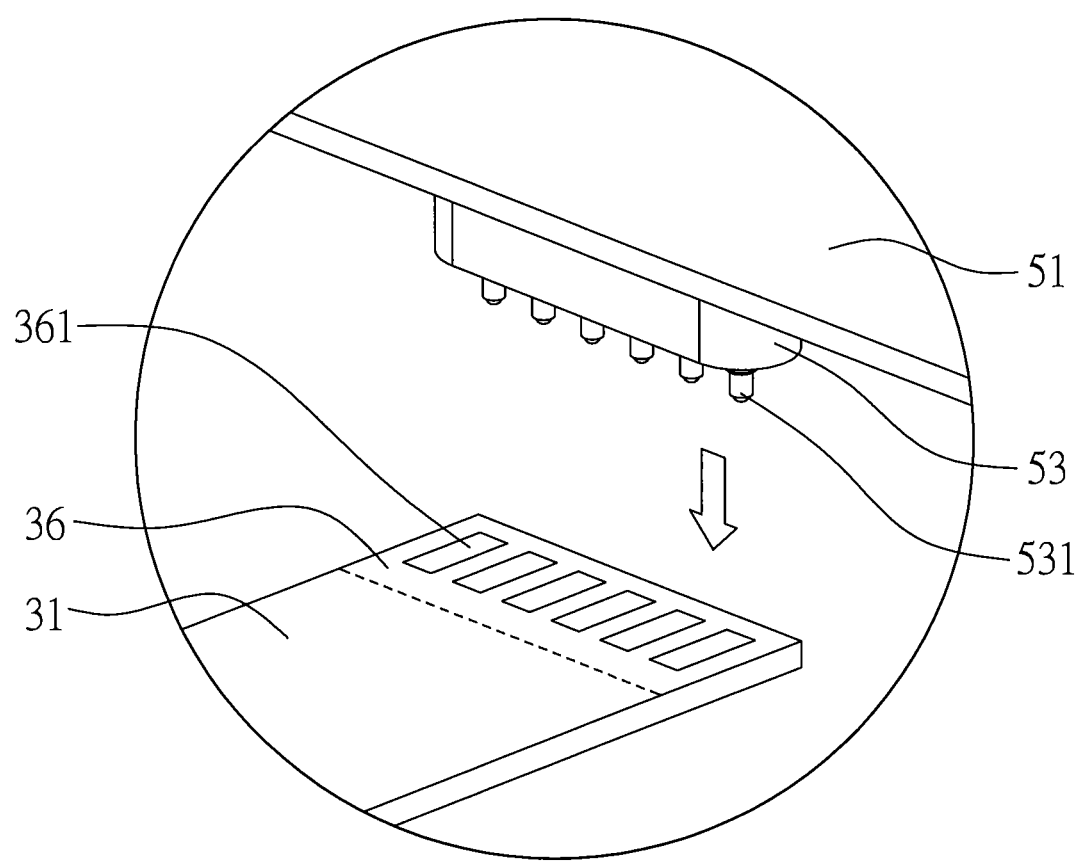
FIG. 9 illustrates an enlarged view showing a second electrical connector and a second connection module in accordance with certain embodiments of the invention.

Referring to FIGS. 4 and 9, the mainboard 31 has a circuit board, and the second electrical connector 36 is mounted on the mainboard 31, according to certain embodiments. Each of the second electrical connector 36 is provided with a plurality of second contact electrodes 361. The second assembling body 51 has a circuit board, and the second connection module 53 is mounted on the second assembling body 51. Each of the second connection module 53 is provided with a plurality of second pins 531. When the second assembling body 51 and the second assembly structure 33 are assembled, the plurality of second pins 531 push against the plurality of second contact electrodes 361.

With the above elaboration, the invention of a modular output device has following features, according to certain embodiments:

1. Data can be transmitted using cushion pads.

Due to the first electrical connector 35 provided on the mainboard 31 and the second connection module 53 provided on the second assembling body 51, when the second assembling body 51 and the second assembly structure 33 of the mainboard 31 are assembled, the second function module 52 can transmit data to the master function module 34. Hence, the second assembling body 51 with a cushion function can transmit data.

2. The assembling status can be output.

The extension status display unit 341 and the first assembling status display unit 421 can output the assembling status of the mainboard 31 and the first assembling body 41. The extension status display unit 341 and the second assembling status display unit 521 can output the assembling status of the mainboard 31 and the second assembling body 51. In this way, the user or the computer can tell the assembling status of the mainboard 31, the first assembling body 41, and the second assembling body 51.

3. Replace function

The first assembling body 41 and the second assembling body 51 can be provided with various first function modules 42 and the second function modules 52. The user can replace the first assembling body 41 or the second assembling body 51 based upon different requirement. The master function module 34 then assists the computer in data transmission with the first function module 42 and the second function module 52, so as to offer different operations.

In conclusion, different first function modules 42 can be provided on the first assembling body 41, and the first assembling body 41 can be mounted on the upper side of the mainboard 31, so as to provide the user with replace function to meet his/her requirement. Although the primary feature of the second assembling body 51 is a cushion pad, due to the configuration of the second connection module 53 and the second electrical connector 36, the second assembling body 51 is provided with a second function module 52 that can transmit data with the master function module 34. Moreover, the extension status display unit 341, the first assembling status display unit 421, and the second assembling status display unit 521 can output the assembling status of the present invention to the user or computer. Therefore, the aforementioned features can be achieved.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

We claim:

1. A modular output device, comprising:
a main body (3), including a mainboard (31), at least one first assembly structure (32) mounted on the mainboard (31), at least one second assembly structure (33) mounted on the mainboard (31), a master function module (34) mounted on the mainboard (31), at least one first electrical connector (35) installed in the first assembly structure (32) and electrically connected to the master function module (34), and at least one second electrical connector (36) installed in the second assembly structure (33) and electrically connected to the master function module (34), wherein the first assembly structure (32) and the second assembly structure (33) are spaced apart from each other;
a first assembling component (4), including a first assembling body (41) detachably mounted on the first assembly structure (32), at least one first function module (42) mounted on the first assembling body (41), and at least one first connection module (43) mounted on the first assembling body (41) and electrically connected to the first function module (42), wherein the position of the first electrical connector (35) located at the first assembly structure (32) corresponds to the position of the first connection module (43) located at the first assembling body (41), so that when the first assembling body (41) is mounted on the first assembly structure (32), the first connection module (43) is electrically connected to the first electrical connector (35), and allows the master function module (34) to have a signal connection with the first function module (42); and
a second assembling component (5), including a second assembling body (51) detachably mounted on the second assembly structure (33), at least one second function module (52) mounted on the second assembling body (51), and at least one second connection module (53) mounted on the second assembling body (51) and electrically connected to the second function module (52), wherein the position of the second electrical connector (36) located at the second assembly structure (33) corresponds to the position of the second connection module (53) located at the second assembling body (51), so that when the second assembling body (51) is mounted on the second assembly structure (33), the second connection module (53) is electrically connected to the second electrical connector (36), and allows the master function module (34) to have a signal connection with the second function module (52);
wherein the master function module (34) is an output circuit with multiple key switches to allow the keyboard to output data, the first assembly structure (32) and the second assembly structure (33) are arranged at intervals on the upper and lower sides of the master function module (34), the first assembling body (41) mounted on the upper side of the mainboard (31), and the second assembling body (51) assembled under the mainboard (31).

2. The modular output device as claimed in claim 1, wherein the master function module (34) has an extension status display unit (341) provided in the mainboard (31), and the master function module (34) controls the extension status display unit (341) to send out the signal connection status between the master function module (34) and the first function module (42), and the signal connection status between the master function module (34) and the second function module (52).

3. The modular output device as claimed in claim 1, wherein the first function module (42) has a first assembling status display unit (421) provided in the first assembling body (41), and the first function module (42) controls the first assembling status display unit (421) to send out the signal connection status between the master function module (34) and the first function module (42).

4. The modular output device as claimed in claim 1, wherein the second function module (52) has a second assembling status display unit (521) provided in the second assembling body (51), and the second function module (52) controls the second assembling status display unit (521) to send out the signal connection status between the master function module (34) and the second function module (52).

5. The modular output device as claimed in claim 1, wherein the master function module (34) is one selected from the group consisting of optical switches, mechanical switches, inductive switches, magnetic switches, touch sensors, proximity sensors, display screens, touch screens, wired connectivity, wireless connectivity, RGB lightings, and combinations thereof.

6. The modular output device as claimed in claim 1, wherein the first function module (42) is one selected from the group consisting of rollers, dials, touch sensors, proximity sensors, display screens, touch screens, wired connectivity, wireless connectivity, RGB lightings, and combinations thereof.

7. The modular output device as claimed in claim 1, wherein the second function module (52) is one selected from the group consisting of batteries, RGB lightings, touch sensors, proximity sensors, and combinations thereof.

8. The modular output device as claimed in claim 1, wherein the surface of the second assembling body (51) is made of cushioning materials.

9. The modular output device as claimed in claim 1, wherein the first electrical connector (35) is provided with a plurality of first contact electrodes (351), the first connection module (43) is provided with a plurality of first pins (431), and the plurality of first pins (431) are detachably in contact with the plurality of first contact electrodes (351).

10. The modular output device as claimed in claim 1, wherein the second electrical connector (36) is provided with a plurality of second contact electrodes (361), the second connection module (53) is provided with a plurality of second pins (531), and the plurality of second pins (531) are detachably in contact with the plurality of second contact electrodes (361).

* * * * *